(12) United States Patent
Lee et al.

(10) Patent No.: US 8,149,565 B2
(45) Date of Patent: Apr. 3, 2012

(54) CIRCUIT BOARD DEVICE AND INTEGRATED CIRCUIT DEVICE

(75) Inventors: Byoung Hwa Lee, Gyunggi-do (KR); Sung Kwon Wi, Seoul (KR); Hong Yeon Cho, Gyunggi-do (KR); Dong Seok Park, Seoul (KR); Sang Soo Park, Gyunggi-do (KR); Min Cheol Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 389 days.

(21) Appl. No.: 12/421,953

(22) Filed: Apr. 10, 2009

(65) Prior Publication Data

US 2010/0149769 A1    Jun. 17, 2010

(30) Foreign Application Priority Data

Dec. 12, 2008 (KR) .......................... 10-2008-0126728

(51) Int. Cl.
  *H01G 15/00* (2006.01)
(52) U.S. Cl. .................. 361/301.1; 361/306.3; 361/760; 361/763; 361/766; 361/767
(58) Field of Classification Search ............... 361/306.3, 361/306.1, 760, 763, 766, 767, 782; 257/300–303
See application file for complete search history.

(56) References Cited

U.S. PATENT DOCUMENTS 6,433,995 B2 * 8/2002 Nakagawa et al. ........... 361/311
2008/0253059 A1 * 10/2008 Eggerding et al. ......... 361/301.4

FOREIGN PATENT DOCUMENTS

| JP | 2006-100682 | 4/2006 |
| KR | 10-2008-0073193 A | 8/2008 |
| KR | 10-2008-0092891 A | 10/2008 |

OTHER PUBLICATIONS

Korean Office Action, w/ English translation thereof, issued in Korean Patent Application No. KR 10-2008-0126728 dated Sep. 7, 2010.

* cited by examiner

*Primary Examiner* — Tuan T Dinh
*Assistant Examiner* — Hung Dang
(74) *Attorney, Agent, or Firm* — McDermott Will & Emery LLP

(57) ABSTRACT

A circuit board device includes a circuit board comprising a mounting area, and first and second power lines and a ground pad formed on the mounting area, and a vertical multilayer chip capacitor (MLCC) comprising a capacitor body, a plurality of first and second polarity inner electrodes, first and second outer electrodes, and a third outer electrode, wherein the first and second power lines are separately disposed on the mounting area, connected to the first and second outer electrodes, and electrically connected to each other only by the vertical MLCC, and the ground pad is disposed between the first and second power lines and connected to the third outer electrode.

17 Claims, 6 Drawing Sheets

CIRCUIT BOARD DEVICE AND INTEGRATED CIRCUIT DEVICE

CROSS-REFERENCE TO RELATED APPLICATIONS

This application claims the priority of Korean Patent Application No. 2008-0126728 filed on Dec. 12, 2008, in the Korean Intellectual Property Office, the disclosure of which is incorporated herein by reference.

BACKGROUND OF THE INVENTION

1. Field of the Invention

The present invention relates to a circuit board device with a multilayer chip capacitor mounted thereon and an integrated circuit device, and more particularly, to a circuit board device and an integrated circuit device capable of effectively removing high frequency noise while retaining high rated-current characteristics and simplifying a power circuit configuration.

2. Description of the Related Art

A multilayer chip capacitor (MLCC) is favorably used as a bypass capacitor disposed within a power circuit of LSI (Large Scale Integration). To serve as the bypass capacitor, the MLCC needs to effectively remove high frequency noise. Such a need is increasing in line with the trend toward high frequencies in electronic devices.

A general MLCC used as the bypass capacitor has a two-terminal structure as shown in FIGS. 1A and 1B. The two-terminal structure refers to a structure in which an MLCC 10 is mounted in a configuration in which two outer electrodes are connected to a circuit board. The related art two-terminal MLCC 10 includes a capacitor body 11 having a laminated structure of dielectric layers 14, and first and second outer electrodes 12a and 12b each formed with a different polarity on an external surface of the capacitor body 11. First and second inner electrodes 13a and 13b are laminated within the capacitor body 11, alternated with the dielectric layers 14, and are connected with the first and second outer electrodes 12a and 12b, respectively.

FIG. 2 is an equivalent circuit diagram schematically showing noise bypassed via the MLCC. The MLCC used as a bypass capacitor may be electrically connected to a pad mounted on the circuit board through soldering, and the mounted pad may be connected to an external circuit via a wiring pattern or a conductive via of the substrate. In detail, as shown in FIG. 2, the MLCC is connected to a power line and a ground line. In particular, the MLCC is vertically connected to the power line.

In this case, however, the MLCC has both equivalent series resistance (ESR) and equivalent series inductance (ESL) components in addition to a capacitance component, and such ESR and ESL components degrade the function of the bypass capacitor. In particular, the ESL components increase the impedance of the capacitor at high frequencies to degrade high frequency noise removing characteristics. The inductance (L) of the bypass capacitor may differ depending on how the MLCC is mounted and structured, and these differences in the inductance of the bypass capacitor significantly affect noise removing characteristics.

In order to effectively remove high frequency noise, a method for using a plurality of MLCCs as shown in FIG. 3 may be taken into consideration. However in this method, the increase in the number of capacitors makes the power circuit configuration complicated.

Thus, a power circuit is required, which employs a smaller number of bypass capacitors to realize a simplified circuit configuration and effectively remove noise.

SUMMARY OF THE INVENTION

An aspect of the present invention provides a circuit board device including a multilayer chip capacitor (MLCC) capable of effectively removing high frequency noise while retaining high rated-current characteristics and simplifying a power circuit configuration.

Another aspect of the present invention provides an integrated circuit device including the circuit board device.

According to an aspect of the present invention, there is provided a circuit board device including: a circuit board including a mounting area, and first and second power lines and a ground pad formed on the mounting area; and a vertical multilayer chip capacitor (MLCC) mounted on the mounting area of the circuit board, including a capacitor body formed by laminating a plurality of dielectric layers and having first and second side faces facing each other and a lower face, a plurality of first and second polarity inner electrodes alternately disposed in a facing manner with the dielectric layer interposed therebetween within the capacitor body, disposed to be perpendicular to the lower face of the capacitor body, led out to the lower face of the capacitor body, and having different polarities, first and second outer electrodes formed on the first and second side faces, partially extending to the lower face of the capacitor body, and electrically connected to the first polarity inner electrodes, and a third outer electrode formed on the lower face of the capacitor body between the first and second outer electrodes and connected to the second polarity inner electrode, wherein the first and second power lines are separately disposed on the mounting area, connected to the first and second outer electrodes, and electrically connected to each other only by the vertical MLCC, and the ground pad is disposed between the first and second power lines and connected to the third outer electrode.

The vertical MLCC may further include a fourth outer electrode having the same polarity as that of the third outer electrode and formed between the first and second outer electrodes on an upper face of the capacitor body. In this case, the MLCC may be vertically symmetrical in its internal and external structures, and accordingly, the MLCC can be mounted regardless of a mounting direction, providing convenience.

The first and second power lines may have the same width. Also, the width of the first and second power lines may be the same as that of the ground pad.

The width of the first and second outer electrodes may be the same as or larger than that of the first and second power lines.

The plurality of first polarity inner electrodes may have a first inner electrode pattern connected to both the first and second outer electrodes, and the plurality of second polarity inner electrodes may have a second inner electrode pattern connected to the third outer electrode.

The respective first polarity inner electrodes may be led out to at least one of the first and second side faces of the capacitor body and to the lower face of the capacitor body. In this case, the first polarity inner electrode may have an 'H' shape.

The second polarity inner electrode may have a cross shape.

The circuit board may further include a conductive via connected to the ground pad. In this case, the circuit board may include a ground plane connected to the conductive via.

According to another aspect of the present invention, there is provided an integrated circuit device including: a circuit board including a mounting area, and first and second power lines and a ground pad formed on the mounting area; a vertical multilayer chip capacitor (MLCC) including a capacitor body mounted on the mounting area of the circuit board, and formed by laminating a plurality of dielectric layers and having first and second side faces facing each other and a lower face, a plurality of first and second polarity inner electrodes alternately disposed in a facing manner with the dielectric layer interposed therebetween within the capacitor body, disposed to be perpendicular to the lower face of the capacitor body, led out to the lower face of the capacitor body, and having different polarities, first and second outer electrodes formed on the first and second side faces, partially extending to the lower face of the capacitor body, and electrically connected to the first polarity inner electrodes, and a third outer electrode formed on the lower face of the capacitor body between the first and second outer electrodes and connected to the second polarity inner electrode; a first electronic component connected to the first power line; and a second electronic component connected to the second power line, wherein the first and second power lines are separately disposed on the mounting area, connected to the first and second outer electrodes, and electrically connected to each other only by the vertical MLCC, and the ground pad is disposed between the first and second power lines and connected to the third outer electrode.

The first electronic component may be a DC-DC converter, and the second electronic component may be an integrated circuit chip. In this case, the second power line may be branched into two or more lines so as to be connected to a power terminal of the integrated circuit chip.

The first electronic component may be a battery, and the second electronic component may be a DC-DC converter.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
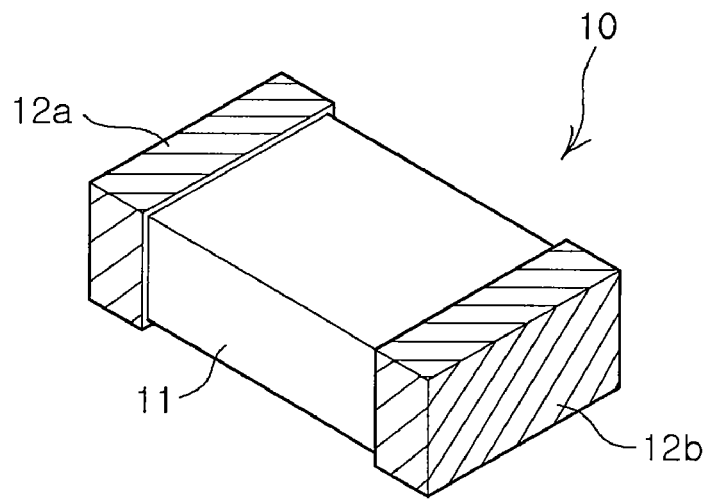
FIGS. 1A and 1B are an external perspective view and an internal plan view illustrating a general multilayer chip capacitor (MLCC), respectively.
Figure 1B:
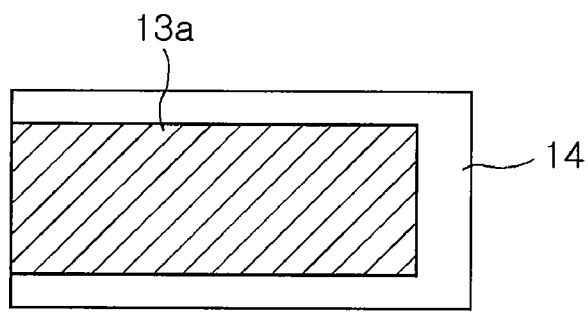
Figure 1B:
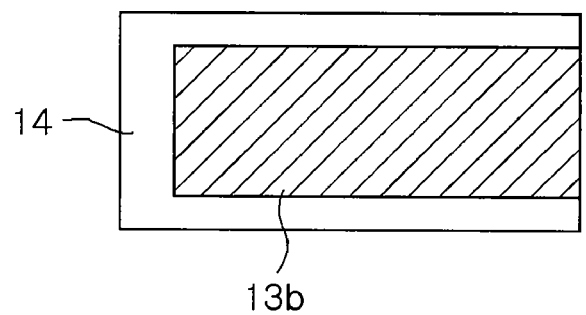
Figure 2:
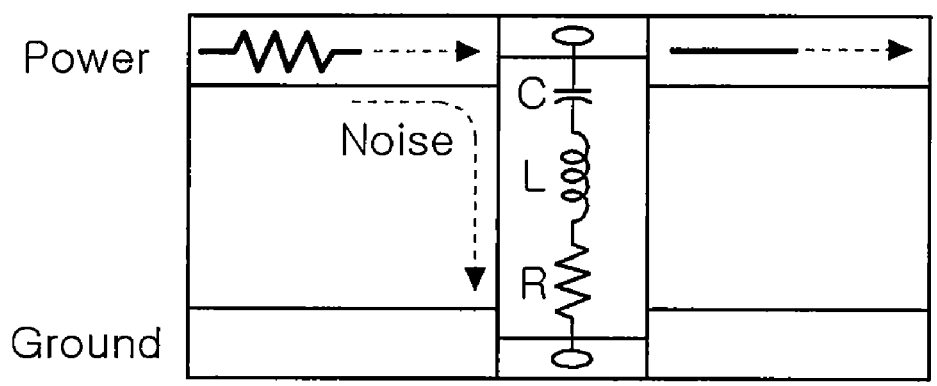
FIG. 2 is a schematic view illustrating how noise is bypassed via the MLCC of FIGS. 1A and 1B.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 4:
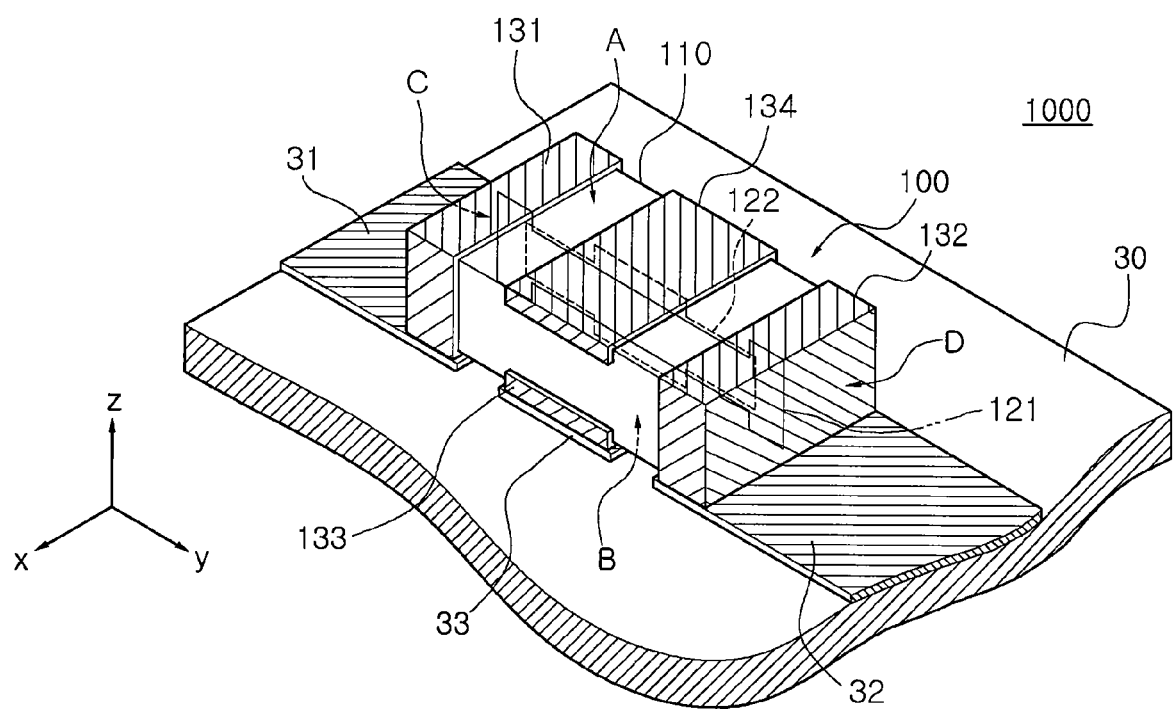
FIG. 4 is a perspective view illustrating a circuit board device according to an embodiment of the present invention.
Figure 5:
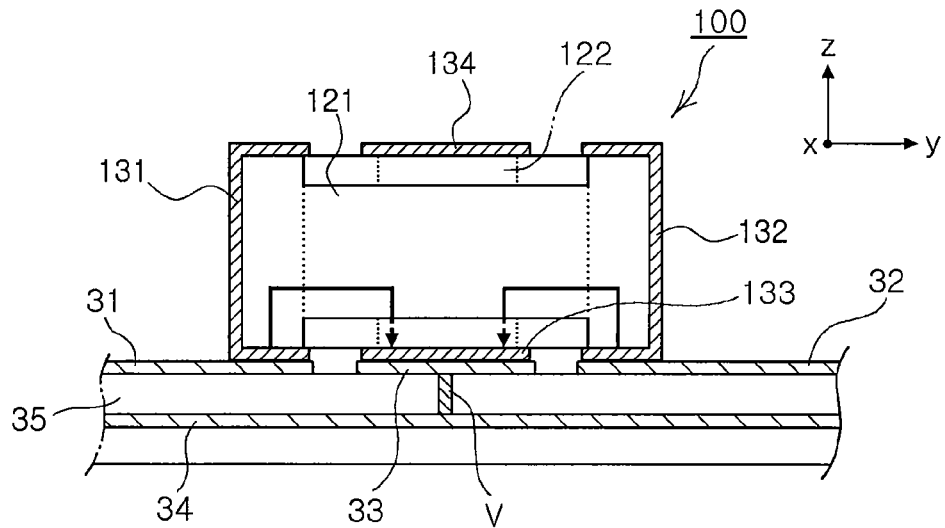
FIG. 5 is a vertical sectional view of FIG. 4.

FIG. 4 is a perspective view illustrating a circuit board device according to an embodiment of the present invention, and FIG. 5 is a vertical sectional view of FIG. 4. With reference to FIGS. 4 and 5, a circuit board device 1000 according to an embodiment of the present invention has a structure in which a three-terminal vertical multilayer chip capacitor (MLCC) 100 is mounted on a circuit board 30. Here, "vertical multilayer (or vertically laminated)" refers to a disposition in which inner electrodes laminated in the capacitor are vertical to the mounting area surface of the circuit board 30, and "3-terminal" refers to the three terminals as capacitor terminals connected to the circuit board 30.

In this embodiment, the vertical MLCC 100 includes a capacitor body 110 formed by the lamination of a plurality of dielectric layers and having a first side face (C) and a second side face (D) facing each other, and a lower face (B). First and second inner electrodes 121 and 122 are alternately laminated within the capacitor body 110 and disposed to be vertical to the circuit board. First and second outer electrodes 131 and 132 are formed on the first and second side faces C and D such that they are connected to the first inner electrode 121. A third outer electrode 133 is formed on the lower face (B) such that it is connected to the second inner electrode 122. A fourth outer electrode 134 is formed on an upper face (A) of the capacitor body 110 facing the lower face (B) such that it is connected to the second inner electrode 122. The fourth outer electrode 134 may be omitted according to circumstances.

The circuit board 30 includes a board part 35 that can be made of various materials, first and second power lines 31 and 32 formed on the board part 35, and a ground pad 33 formed between the first and second power lines 31 and 32. The region of the board part 35 on which the first and second power lines 31 and 32 and the ground pad 33 are formed are provided as a mounting area for mounting the capacitor. On the mounting area of the board part 35, the first and second power lines 31 and 32 and the ground pad 33 are arranged in one direction (i.e., y direction). In this case, the first and second power lines 31 and 32 may have the same polarity (e.g., positive (+) polarity), and the ground pad 33 may have the opposite polarity (e.g., negative (−) polarity). The first and second power lines 31 and 32 and the ground pad 33 are connected to the outer electrodes 131, 132, and 133 with corresponding polarities of the MLCC 100 mounted thereon.

The first and second power lines 31 and 32 are elements constituting a power supply circuit in a digital device and the like, and the MLCC 100 is disposed between the first and second power lines 31 and 32 to perform a bypass function. To this end, a DC-DC converter may be electrically connected to the first power line 31, and an integrated circuit chip may be electrically connected to the second power line 32 (to be described). In particular, in this embodiment, the first and second power lines 31 and 32 are electrically connected only by the MLCC 100, the bypass capacitor. Namely, unlike the related art in which a plurality of capacitors are connected in parallel to a single power line, in this embodiment, the vertical MLCC 100 is disposed between the separate first and second power lines 31 and 32. In this case, only the single vertical MLCC may be disposed between the first and second power lines 31 and 32 and used as proposed by the present invention (to be described), or a plurality of vertical MLCCs may be also used as necessary.

Figure 6:
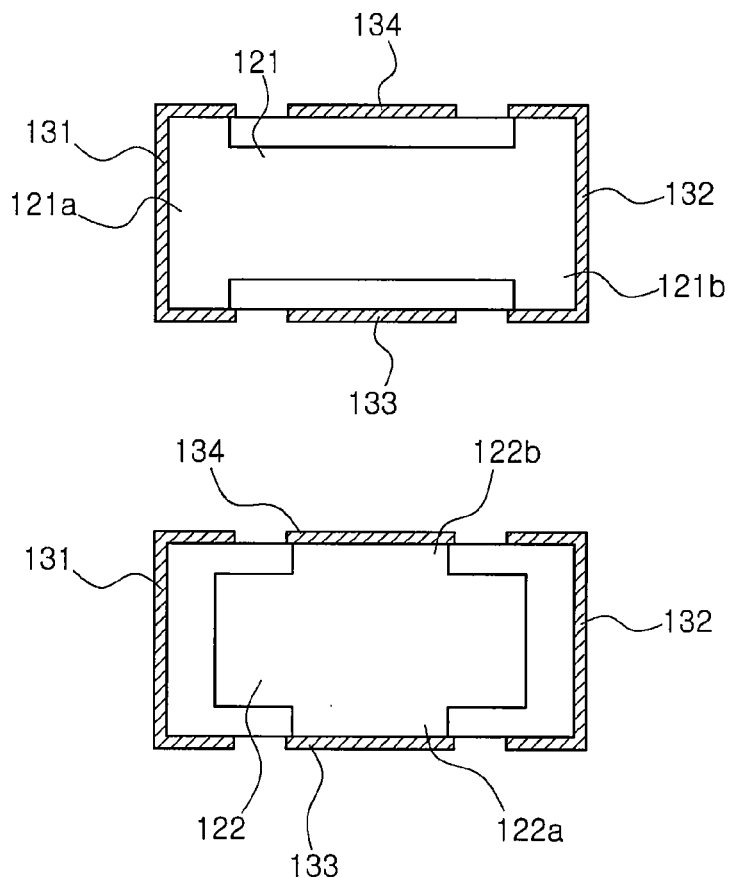
FIGS. 6 and 7 are vertical sectional views illustrating an inner electrode structure that may be employed for the MLCC of FIG. 4.
Figure 7:
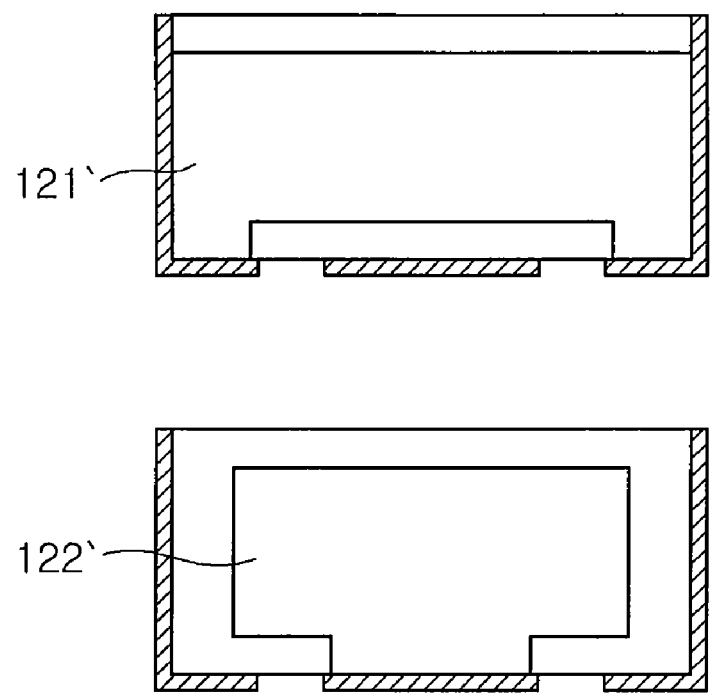

The first and second power lines 31 and 32 are electrically connected only by the bypass capacitor, and in order to reduce ESL, the MLCC 100 may include an inner electrode having such shape as shown in FIGS. 6 and 7.

FIGS. 6 and 7 are vertical sectional views illustrating an inner electrode structure that may be employed for the MLCC of FIG. 4. First, with reference to FIG. 6, the MLCC 100 includes the capacitor body 110 and the first to fourth outer electrodes 131 to 134. The capacitor body 110 is formed by laminating the plurality of dielectric layers 110a and 110b. Within the capacitor body 110, the first inner electrode 121 of a first polarity and the second inner electrode 122 of a second polarity are alternately disposed in a facing manner with the dielectric layer interposed therebetween. In this case, the first and second inner electrodes 121 and 122 may be disposed to be vertical to the lower face (B) (or the capacitor mounting surface), and accordingly, current may flow directly to the first inner electrode 121 only through a portion corresponding to the thickness of the first and second outer electrodes 131 and 132. Likewise, current may flow directly to the second inner electrode 122 only through a portion corresponding to the thickness of the third outer electrode 133. Thus, compared with the case where the inner electrode is horizontally mounted on the circuit board, the current path is shortened to reduce the inductance component of the MLCC 100, and thus, bypass performance can be improved.

The first and second outer electrodes 131 and 132 having the same polarity are formed on the first side face (C) and the second side (D), extend by a certain width to the lower face (B), and are electrically connected with the first inner electrode 121. As illustrated, the first and second outer electrodes 131 and 132 may extend to the upper face (A). The third outer electrode 133 having a different polarity from that of the first outer electrode 131 is formed with a certain width between the first and second outer electrodes 131 and 132 on the lower face (B) along the lamination direction (i.e., x direction) and electrically connected with the second inner electrode 122. Further, the fourth outer electrode 134 having the same polarity as the third outer electrode 133 may be disposed on the upper face (A) and electrically connected with the second inner electrode 122.

As shown in FIG. 6, the first inner electrode 121 has a conductive pattern in an 'H' shape, and connected to the first and second outer electrodes 131 and 132 via first and second leads 121a and 121b. In particular, the first lead 121a is led out to the first side face (C), the upper face (A), and the lower face (B), and the second lead 121b is led out to the second side face (D), the upper face (A) and the lower face (B). The second inner electrode 122 has a cross-shaped (+) conductive pattern and is connected to the third and fourth outer electrodes 133 and 134 via the third and fourth leads 122a and 122b. Because the leads 121a and 121b are in contact with the corresponding outer electrodes 131 or 132 with a large contact area along the side faces (C or D) the lower face (B) and the upper face (A), current flowing at each of the leads 121a and 121b has a wide path, and thus, the ESL of the capacitor can be reduced. In addition, the wide current path makes the resistance value of the inner electrodes lower, and accordingly, rated-current characteristics can be also improved.

In this embodiment, the internal and external structures of the vertical MLCC 100 are vertically symmetrical, eliminating the directionality of the chip. Thus, in mounting the vertical MLCC 100 on the circuit board 30, any of the upper face (A) and lower face (B) may be provided as amounting surface. Accordingly, the capacitor 100 can be mounted on the circuit board without consideration of the direction of the mounting surface. The shape of the inner electrode may not be limited to the shape as shown in FIG. 6. That is, the inner electrode may have any shape, so long as it can connect the first and second outer electrodes. For example, as shown in FIG. 7, a first inner electrode 121' may extend to the lower side, namely, toward the circuit board, and likewise, the second inner electrode 122' may also extend to the lower side. Accordingly, in this embodiment, the outer electrodes may not extend up to the upper face of the capacitor body.

With reference to FIG. 5, as for the mounting form of the vertical MLCC 100, a conductive via (v) connected with the ground pad 33 extends vertically through the board part 35. The conductive via (v) may be connected to a ground plane 34 within the board part 35. In the present embodiment, the ground pad 33 is connected to the ground plane 34 via the conductive via (v). Meanwhile, the power lines 31 and 32 are formed in a linear shape, not a planar shape, on the circuit board 30. Accordingly, the width of the power lines 31 and 32 may be smaller than or the same as that of the vertical MLCC 100. In this case, the width of the power lines 31 and 32 and that of the vertical MLCC 100 may be defined as widths perpendicular to the lengthwise direction of the power lines 31 and 32.

Figure 8:
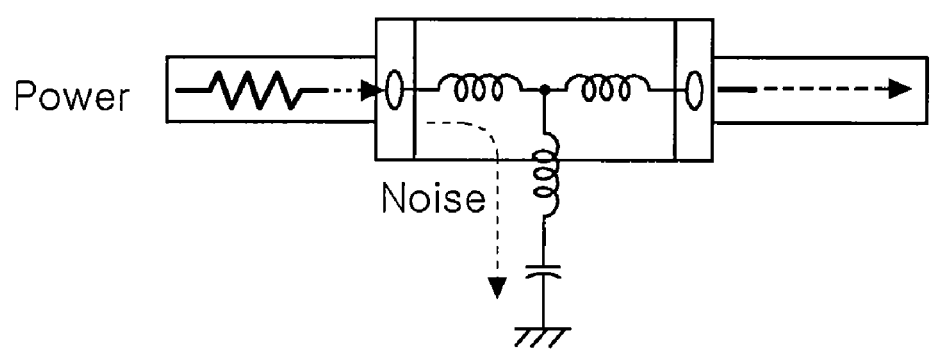
FIG. 8 is an equivalent circuit diagram of the MLCC having a mounting structure of FIG. 4.

With such a connection scheme, when power is applied, the MLCC 100 may have a current flow as indicated by the arrows in FIG. 5. In detail, the current formed by the first and second power lines 31 and 32 flows to the second polarity inner electrode 122 via the first polarity inner electrode 121 connected to the first and second outer electrodes 131 and 132. Such current flow reduces the value of an inductance component connected in series to a capacitance component of the MLCC 100 to about 20 pH, which is very small. This will be described in more detail with reference to FIG. 8. FIG. 8 is an equivalent circuit diagram of the MLCC having the mounting structure as shown in FIG. 4.

An inductance component of the second polarity inner electrode 122 is branched between inductance components by the neighboring first polarity inner electrode 121 so as to be connected in series to the capacitance component. Namely, the inductance component connected in series with the capacitance component may be confined to the inductance component of the second polarity inner electrode 122. The inductance component connected in series to the capacitance component increases impedance at a high frequency. Thus, in the present embodiment, the inductance component is adjusted to be relatively small to improve the bypass function. Therefore, advantageously, there is no need to employ a large number of MLCCs to perform the bypass function at high frequencies.

Figure 9:
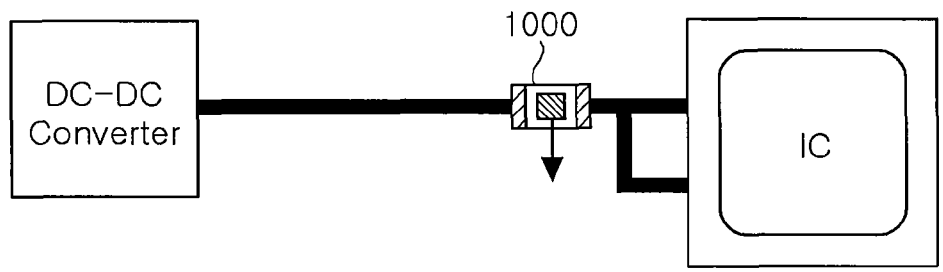
FIG. 9 is a view illustrating a case of actually employing the circuit board device having the structure of FIG. 4 for a power circuit of a digital device.

FIG. 9 illustrates the case of actually employing the circuit board device having the structure of FIG. 4 for a power circuit of a digital device. As shown in FIG. 9, a power line may be disposed to be electrically connected between a DC-DC converter and an integrated circuit (IC) chip. In the related art, a plurality of bypass capacitors are connected in parallel to a power line and the power line is branched to be connected with a power pin of the IC chip, causing a problem in that the capacitor should be connected to each branched power line. However, in the present embodiment, the power line (i.e., the second power line in FIG. 4) is branched to be connected to the IC chip by use of the single vertical MLCC in a state that noise has been removed. Accordingly, the configuration can be simplified by reducing the number of bypass capacitors used for the power circuit of the digital device, and a space shortage problem can be settled. Thus, the circuit board device can be advantageously employed in recent digital devices. In addition, unlike the illustration of FIG. 9, the circuit board device having the configuration of FIG. 4 may be used by being connected with various electronic components. For example, a battery may be connected to the first power line of the circuit board device, and the DC-DC converter may be connected to the second power line of the circuit board device.

Figure 3:
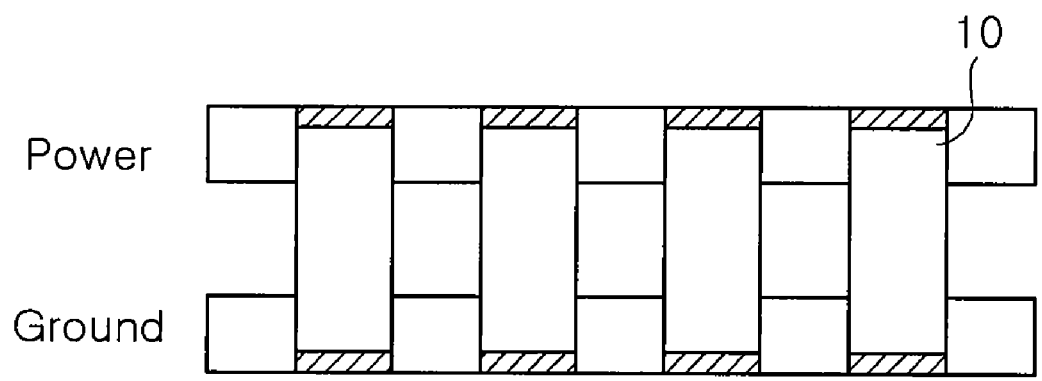
FIG. 3 is a schematic equivalent circuit diagram of the MLCC of FIG. 1 employed as a bypass capacitor.
Figure 10:
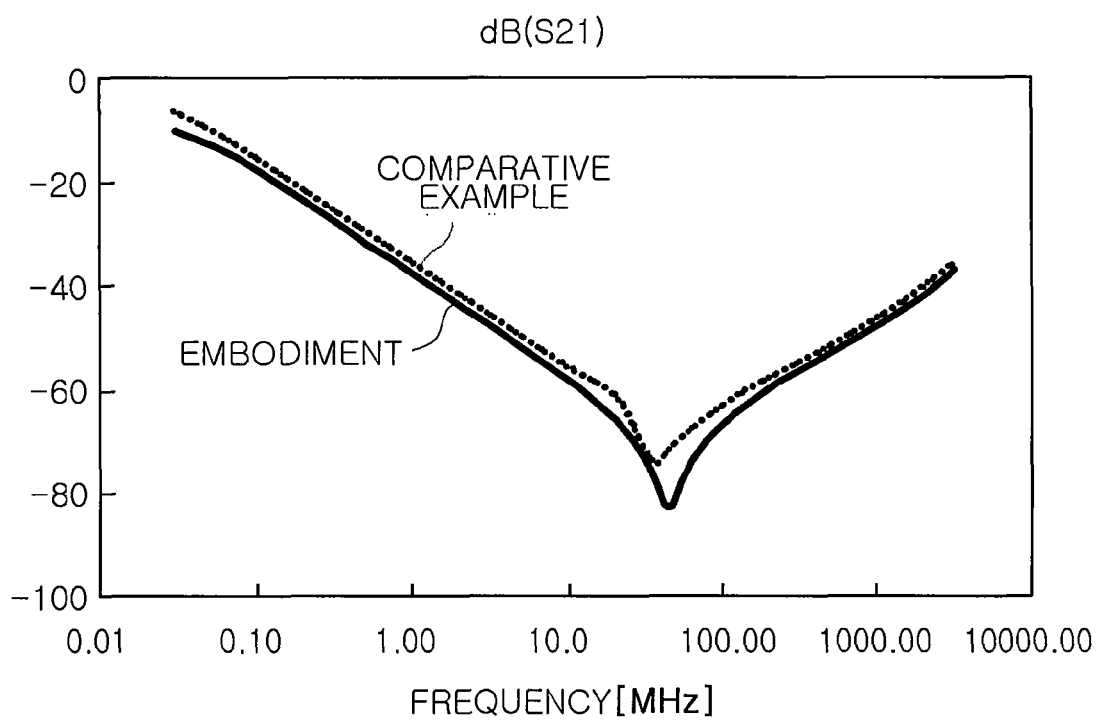
FIG. 10 is a graph depicting the attenuation characteristics of the embodiment of the present invention and a comparative example.

By mounting the vertical MLCC proposed by the present invention in the manner as described above, the number of bypass capacitors can be reduced while retaining substantially the same level of bypass function as the related art employing the plurality of capacitors. FIG. 10 is a graph depicting the attenuation characteristics of the embodiment of the present invention and a comparative example. In the comparative example, four two-terminal capacitors as shown in FIG. 3 were used.

With reference to FIG. 10, it is noted that when the three-terminal vertical MLCC is mounted such that the first and second power lines are electrically connected, it has substantially the same attenuation characteristics as in the case of using four two-terminal capacitors together.

As set forth above, according to exemplary embodiments of the invention, the circuit board device including the MLCC can effectively remove high frequency noise while retaining the high rated-current characteristics and obtain a simple power circuit configuration. In addition, in the MLCC, because the inner electrodes and outer electrodes are in contact on a large area to each other, the resistance value of the inner electrodes can be reduced, and accordingly, the rated-current characteristics can be improved.

The integrated circuit device including the circuit board device can be provided.

While the present invention has been shown and described in connection with the exemplary embodiments, it will be apparent to those skilled in the art that modifications and variations can be made without departing from the spirit and scope of the invention as defined by the appended claims.

What is claimed is:

1. A circuit board device comprising:
   a circuit board comprising a mounting area, and first and second power lines and a ground pad formed on the mounting area; and
   a vertical multilayer chip capacitor (MLCC) mounted on the mounting area of the circuit board, comprising:
      a capacitor body having a plurality of laminated dielectric layers and having first and second side faces facing each other and a lower face;
      a plurality of first and second polarity inner electrodes alternately disposed in a facing manner with the dielectric layer interposed therebetween within the capacitor body, disposed to be perpendicular to the lower face of the capacitor body, led out to the lower face of the capacitor body, and having different polarities;
      first and second outer electrodes formed on the first and second side faces, partially extending to the lower face of the capacitor body, and electrically connected to the first polarity inner electrodes; and
      a third outer electrode formed on the lower face of the capacitor body between the first and second outer electrodes and connected to the second polarity inner electrode;
   wherein the first and second power lines are separately disposed on the mounting area, connected to the first and second outer electrodes, and electrically connected to each other only by the vertical MLCC,
   the ground pad is disposed between the first and second power lines and connected to the third outer electrode, and
   wherein current from the first and second power lines flows through the vertical MLCC to the ground pad.

2. The device of claim 1, wherein the vertical MLCC further comprises a fourth outer electrode having the same polarity as that of the third outer electrode and formed between the first and second outer electrodes on an upper face of the capacitor body.

3. The device of claim 1, wherein the MLCC is vertically symmetrical in its internal and external structures.

4. The device of claim 1, wherein the first and second power lines have the same width.

5. The device of claim 4, wherein the width of the first and second power lines is the same as that of the ground pad.

6. The device of claim 1, wherein the width of the first and second outer electrodes is the same as or larger than that of the first and second power lines.

7. The device of claim 1, wherein the plurality of first polarity inner electrodes have a first inner electrode pattern connected to both the first and second outer electrodes, and the plurality of second polarity inner electrodes have a second inner electrode pattern connected to the third outer electrode.

8. The device of claim 1, wherein the respective first polarity inner electrodes are led out to at least one of the first and second side faces of the capacitor body and to the lower face of the capacitor body.

9. The device of claim 8, wherein the first polarity inner electrode has an 'H' shape.

10. The device of claim 1, wherein the second polarity inner electrode has a cross shape.

11. The device of claim 1, wherein the circuit board further comprises a conductive via connected to the ground pad.

12. The device of claim 11, wherein the circuit board further comprises a ground plane connected to the conductive via.

13. The device of claim 1, wherein the ground pad is disposed between the first and second power lines in a horizontal direction, which is in parallel with the top surface of the circuit board.

14. An integrated circuit device comprising:
   a circuit board comprising a mounting area, and first and second power lines and a ground pad formed on the mounting area;
   a vertical multilayer chip capacitor (MLCC) mounted on the mounting area of the circuit board, comprising:
      a capacitor body having a plurality of laminated dielectric layers and having first and second side faces facing each other and a lower face;
      a plurality of first and second polarity inner electrodes alternately disposed in a facing manner with the dielectric layer interposed therebetween within the capacitor body, disposed to be perpendicular to the lower face of the capacitor body, led out to the lower face of the capacitor body, and having different polarities,
      first and second outer electrodes formed on the first and second side faces, partially extending to the lower face of the capacitor body, and electrically connected to the first polarity inner electrodes; and
      a third outer electrode formed on the lower face of the capacitor body between the first and second outer electrodes and connected to the second polarity inner electrode;
   a first electronic component connected to the first power line; and a second electronic component connected to the second power line, wherein the first and second power lines are separately disposed on the mounting area, connected to the first and second outer electrodes, and electrically connected to each other only by the vertical MLCC, and the ground pad is disposed between the first and second power lines and connected to the third outer electrode, and current from the first and second power lines flows through the vertical MLCC to the ground pad.

15. The device of claim 14, wherein the first electronic component is a DC-DC converter, and the second electronic component is an integrated circuit chip.

16. The device of claim 15, wherein the second power line is branched to two or more lines so as to be connected to a power terminal of the integrated circuit chip.

17. The device of claim 14, wherein the first electronic component is a battery, and the second electronic component is a DC-DC converter.

* * * * *